(12) United States Patent  
Gao

(10) Patent No.: US 8,700,844 B2  
(45) Date of Patent: Apr. 15, 2014

(54) CONTROL METHOD, MEMORY, AND PROCESSING SYSTEM UTILIZING THE SAME

(71) Applicant: Via Technologies, Inc., New Taipei (TW)

(72) Inventor: Ming-Xing Gao, New Taipei (TW)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/913,017

(22) Filed: Jun. 7, 2013

(65) Prior Publication Data

US 2013/0282989 A1    Oct. 24, 2013

Related U.S. Application Data

(63) Continuation of application No. 12/357,464, filed on Jan. 22, 2009, now Pat. No. 8,499,115.

(60) Provisional application No. 61/026,185, filed on Feb. 5, 2008.

(51) Int. Cl.  
*G06F 12/00* (2006.01)

(52) U.S. Cl.  
USPC ............ 711/103; 711/E12.015; 711/E12.078; 711/E12.088

(58) Field of Classification Search  
USPC ............ 711/103, E12.015, E12.078, E12.088  
See application file for complete search history.

(56) References Cited

U.S. PATENT DOCUMENTS

| | | | |
|---|---|---|---|
| 5,515,317 A | 5/1996 | Wells et al. | |
| 5,671,388 A | 9/1997 | Hasbun | |
| 6,260,103 B1 | 7/2001 | Alexis et al. | |
| 6,965,963 B1 * | 11/2005 | Nakanishi et al. | 711/103 |
| 6,988,175 B2 | 1/2006 | Lasser | |
| 7,035,993 B2 * | 4/2006 | Tai et al. | 711/206 |
| 7,073,014 B1 | 7/2006 | Roohparvar | |
| 7,080,193 B2 | 7/2006 | Roohparvar | |
| 7,164,601 B2 | 1/2007 | Mitani et al. | |
| 7,197,594 B2 | 3/2007 | Raz et al. | |
| 7,243,185 B2 | 7/2007 | See et al. | |
| 7,299,314 B2 | 11/2007 | Lin et al. | |

(Continued)

FOREIGN PATENT DOCUMENTS

CN          1662993         8/2005

OTHER PUBLICATIONS

IBM Technical Disclosure Bulletin; "Controlling Buffers;" Oct. 1, 1980; vol. 23; Issue 5; pp. 2122-2123.

(Continued)

*Primary Examiner* — Edward Dudek, Jr.  
*Assistant Examiner* — Christopher Birkhimer  
(74) *Attorney, Agent, or Firm* — McClure, Qualey & Rodack, LLP

(57) ABSTRACT

A control method for a memory is provided. The memory includes a plurality of storage units, each storing a plurality of bits. In a read mode, a read command is provided to the memory. The value of a most significant bit (MSB) of each storage unit is obtained and recorded. The value of the most significant bits is output. The value of a neighboring bit of each storage unit is obtained and recorded. The neighboring bit neighbors the most significant bit. The value of the neighboring bits is output.

20 Claims, 5 Drawing Sheets

(56) References Cited

U.S. PATENT DOCUMENTS

| | | |
|---|---|---|
| 7,315,916 B2 | 1/2008 | Bennett et al. |
| 7,328,304 B2 | 2/2008 | Royer et al. |
| 2005/0021883 A1 | 1/2005 | Shishizuka et al. |
| 2005/0141312 A1 | 6/2005 | Sinclair et al. |
| 2005/0193164 A1 | 9/2005 | Royer et al. |
| 2005/0223158 A1 | 10/2005 | See et al. |
| 2007/0245098 A1 | 10/2007 | Takada |

OTHER PUBLICATIONS

Webopedia; "Parallel;" Sep. 1, 1996; pp. 1-2 http://web.archive.org/web/20020815175718/http://www.webopedia.com/TERM/P/parallel.html.

Jim Handy; "The Cache Memory Book: The Authoritative Reference on Cache Design;" Second Edition; pp. 222-223; 1998.

Webopedia; "Pipelining;" May 25, 2001; pp. 1-2 http://web.archive.org/web/20020815182813/http://www.webopedia.com/TERM/P/pipelining.html.

Webopedia; "Big-Endian;" Jun. 21, 2002; pp. 1-2 http://web.archive.org/web/20020803034408/http://www.webopedia.com/TERM/b/big_endian.html.

Margaret Rouse; "Most Significant Bit or Byte;" Sep. 2005; pp. 1-3 http://whatis.techtarget.com/definition/most-significant-bit-or-byte.

University of Maryland; "Big and Little Endian;" Dec. 4, 2005; pp. 1-3 http://web.archive.org/web/20051204174602/http://www.cs.umd.edu/class/sum2003/cmsc311/Notes/Data/endial.html.

Better Explained; "Understanding Big and Little Endian Byte Order," Feb. 20, 2007; pp. 1-9 http://web.archive.org/web/20070220093958/http://betterexplained.com/articles/understanding-big-and-little-endian-byte-order/.

\* cited by examiner

US 8,700,844 B2

CONTROL METHOD, MEMORY, AND PROCESSING SYSTEM UTILIZING THE SAME

CROSS REFERENCE TO RELATED APPLICATIONS

This application is a Continuation of U.S. patent application Ser. No. 12/357,464, filed Jan. 22, 2009 (U.S. Pat. No. 8,499,115) and entitled "Control Method Memory and Processing System Utilizing the Same", which claims the benefit of provisional Application No. 61/026,185, filed on Feb. 5, 2008, the entirety of which are incorporated by reference herein.

BACKGROUND OF THE INVENTION

1. Field of the Invention

The invention relates to a control method, and more particularly to a control method for a memory.

2. Description of the Related Art

Flash memories comprise NOR flash memories and NAND flash memories. The read speed of the NOR flash memory is faster than the NAND flash memory. But, the capacity of the NOR flash memory is smaller. The NAND flash memory possesses favorable advantages of having a smaller volume, lower power consumption, and larger capacity. Thus, NAND flash memories are widely used in different fields such as fields for mobile products. The NAND flash memory comprises various storage units. When the storage unit only stores a single bit, the storage unit is referred to as a single level cell (SLC). When the storage unit can store various bits, the storage unit is referred to as a multi level cell (MLC). The read speed and the write speed of the NAND flash memory are slower and the reliability of the NAND flash memory is lower than the NOR flash memory.

FIG. 1A is a flowchart of a conventional read method for an NAND flash memory. The NAND flash memory comprises various multi level cells. As shown in FIG. 1A, an external device issues a read command to the NAND flash memory (step 110). When the NAND flash memory receives the read command, data is provisionally stored in an internal cache (step 120). After all data are stored in the internal cache, the external device reads the data stored in the internal cache (step 130).

FIG. 1B is a timing diagram of reading a multi level cell. Assuming the capacity of the NAND flash memory is (4096+128) bytes and each storage unit stores two bits, when an external device desires to read the data stored in the NAND flash memory, the NAND flash memory requires 175 ns to receive the read command and then requires 50 us to store data in the internal cache. After the all data are stored in the internal cache, the external device requires 105.6 us to receive data stored in the internal cache. As described previously, the read speed and the write speed of the NAND flash memory are slower because the NAND flash memory stores various bits. Thus, to improve performance of the NAND flash memory, a control method is required to raise the read speed and the write speed.

BRIEF SUMMARY OF THE INVENTION

A control method for a memory comprising a plurality of storage units, each storing a plurality of bits is provided. An exemplary embodiment of a control method for a memory is described in the following. In a read mode, a read command is provided to the memory. The value of a most significant bit (MSB) of each storage unit is obtained and recorded. The value of the most significant bits is output. The value of a neighboring bit of each storage unit is obtained and recorded. The neighboring bit neighbors the most significant bit. The value of the neighboring bits is output.

Memories are provided. An exemplary embodiment of a memory, which is coupled to a memory module and a command unit providing a read command to the memory in a read mode, comprises a plurality of storage units and a control circuit. Each of the storage units stores a plurality of bits. The control circuit, based on the read command, obtains the values of a most significant bit of each storage unit and records the values of the most significant bits, and then obtains the values of a neighboring bit of each storage unit and records the values of the neighboring bits in the memory module. Each neighboring bit neighbors one corresponding most significant bit. The memory module outputs the values of the most significant bits and the neighboring bits.

Processing systems are also provided. An exemplary embodiment of a processing system comprises a command unit, a memory, and a memory module. The command unit provides a read command in a read mode. The memory comprises a plurality of storage units and a control circuit. Each of the storage units stores a plurality of bits. The control circuit, based on the read command, obtains the values of a most significant bit and then obtains a neighboring bit of each storage unit. The neighboring bit neighbors the most significant bit. The memory module comprises a first page buffer and a second page buffer. The first page buffer records the values of the most significant bits. The second page buffer records the values of the neighboring bits. When the values of the most significant bits are recorded in the first page buffer, the command unit activates a first ready signal. When the values of the neighboring bits are recorded in the second page buffer, the command unit activates a second ready signal.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
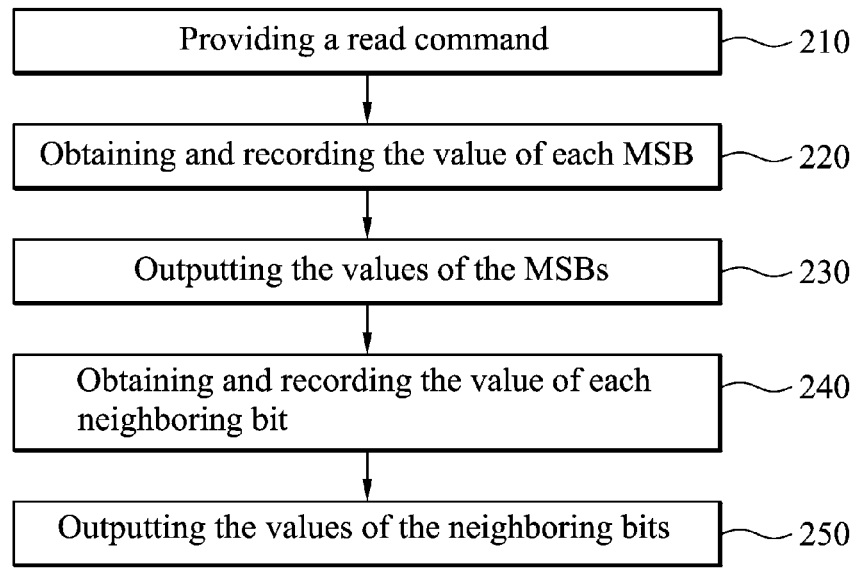
FIG. 2A is a flowchart of an exemplary embodiment of a control method for a memory in a read mode.

FIG. 2A is a flowchart of an exemplary embodiment of a control method for a memory in a read mode. In this embodiment, the memory is an NAND flash memory comprising a plurality of storage units. The storage units are multi level cells. As shown in FIG. 2A, a read command is provided to the memory (step 210). In one embodiment, the read command is provided by a command unit. The command unit is controlled by an NAND flash memory controller.

The value of a most significant bit (MSB) of each storage unit is obtained and recorded (step 220). In one embodiment, various preset values can be defined according to the bit number of the storage unit. The value of the MSB is obtained according to one of the preset values. For example, if the storage unit stores two bits, the number of the preset values is 3. In one embodiment, the minimum value among the three preset values is served as a first preset value and the maximum value among the three preset values is served as a third preset value. In this case, the value of the MSB of each storage unit is obtained according to a second preset value (such as a middle value) between the first and the third preset value.

For example, if each storage unit stores two bits. The value of the two bits may be 00, 01, 11, or 10. Thus, voltages V1~V4 is provided to the storage units to obtain the value of the two bits, wherein the voltage V1 is less than the voltage V2, the voltage V2 is less than the voltage V3, and the voltage V3 is less than the voltage V4. Additionally, three preset values P1~P3 are defined according to the voltages V1~V4. The invention does not limit the method for defining the preset values P1~P3. In one embodiment, the preset value P1=(V1+V2)/2, the middle preset value P2=(V2+V3)/2, and the preset value P3=(V3+V4)/2. Since the voltage V1 is less than the voltage V2, the voltage V2 is less than the voltage V3, and the voltage V3 is less than the voltage V4, the preset value P1 is less than the preset value P2 and the preset value P2 is less than the preset value P3.

The middle preset value P2 is provided to each storage unit. The value of the MSB of each storage unit is obtained according to the result of providing the middle preset value P2. Assuming a storage unit stores two bits and the value of the two bits is 10 or 11, when the middle preset value P2 is provided to the storage unit, the result of providing the middle preset value P2 may generate a first state, such as the storage unit at a high level. Assuming a storage unit stores two bits and the value of the two bits is 00 or 01, when the middle preset value P2 is provided to the storage unit, the result of providing the middle preset value P2 may generate a second state, such as the storage unit at a low level. Thus, the value of the MSB of each storage unit is obtained according to the result of providing the middle preset value P2. In one embodiment, the value of the MSB of each storage unit can be obtained according to the results of providing other preset values.

In some embodiments, if the storage unit stores three bits, eight voltages (V1~V8) are utilized to obtain the value stored in the storage unit. The preset values P1~P7 are defined according to the voltage V1~V8, wherein the preset value P1 is a minimum value and the preset value P7 is a maximum value. When the middle value (such as the preset value P4) is provided to the storage unit, the value of the MSB of the storage unit can be obtained according to the result of providing the preset value P4.

Furthermore, in other embodiments, the values of all MSBs are recorded in a first page buffer. In this embodiment, the values of all MSBs are simultaneously obtained and simultaneously recorded in the first page buffer.

After the values of all MSBs are recorded, the recorded result is output (step 230). In one embodiment, when the values of all MSBs are completely recorded in the first page buffer, a first ready signal is activated. When the first ready signal is activated, the first page buffer outputs the recorded values. In one embodiment, the first page buffer outputs the recorded values to a bus.

The value of a neighboring bit of each storage unit is obtained and recorded (step 240). The neighboring bit neighbors the MSB. In one embodiment, other unused preset values can be utilized to obtain the values of the neighboring bits. For example, assuming the middle preset value P2 is provided and the result of providing the middle preset value P2 is the storage unit at the high level, the preset value P3 is provided to the storage unit to obtain the value of the neighboring bit because the preset value P3 is higher than the middle preset value P2. If the result of providing the middle preset value P2 is the storage unit at the low level, the preset value P1 is provided to the storage unit to obtain the value of the neighboring bit because the preset value P1 is less than the middle preset value P2.

If the storage unit stores two bits, the neighboring bit is a least significant bit (LSB). Additionally, a second page buffer can be utilized to record the values of the neighboring bits. In one embodiment, the first page buffer is independent of the second page buffer. In another embodiment, a single buffer is divided into a first half and a second half. The first half of the single buffer is served as the first page buffer. The second half of the single buffer is served as the second page buffer.

In one embodiment, the first and the second page buffers simultaneously output the recorded values. In some embodiments, after the first page buffer completely outputs the recorded values, the second page buffer starts outputting the recorded values.

When the values of all neighboring bits have been obtained and recorded, the result of recording the values of the neighboring bits is output (step 250). In one embodiment, the values of all neighboring bits have been recorded in the second page buffer and the second page buffer outputs the recorded value to the bus.

In some embodiments, a step occurs between the steps 240 and 250. The step is determining whether the values of all neighboring bits have been completely obtained and recorded. If the values of all neighboring bits have been completely obtained and recorded, the step 250 is executed. If the values of some neighboring bits have not been completely obtained and recorded, the step 250 is not executed until the values of all neighboring bits have been obtained and recorded.

Figure 2B:
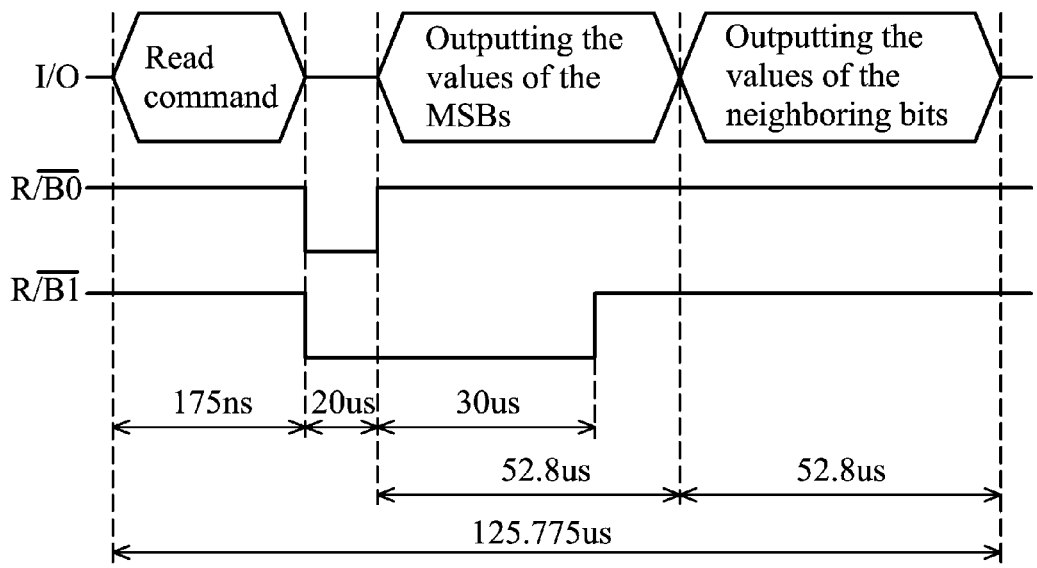
FIG. 2B is a timing diagram of the control method.

FIG. 2B is a timing diagram of the control method. Assuming the capacity of an NAND flash memory is (4096+128) bytes and each storage unit stores two bits, as shown in FIG. 2B, the memory requires 175 ns to receive the read command. Since only one bit is captured in each storage unit, the first page buffer only utilizes 20 us to record all captured bits. After the first page buffer completely records all captured bits, the first ready signal R/$\overline{B0}$ is activated to a high level. When the first ready signal R/$\overline{B0}$ is activated, the captured bits recorded in the first page buffer are output. At this time, the value of each neighboring bit is obtained and recorded. After the second page buffer completely records the values of all neighboring bits, the second ready signal R/$\overline{B1}$ is activated to the high level.

Figure 1A:
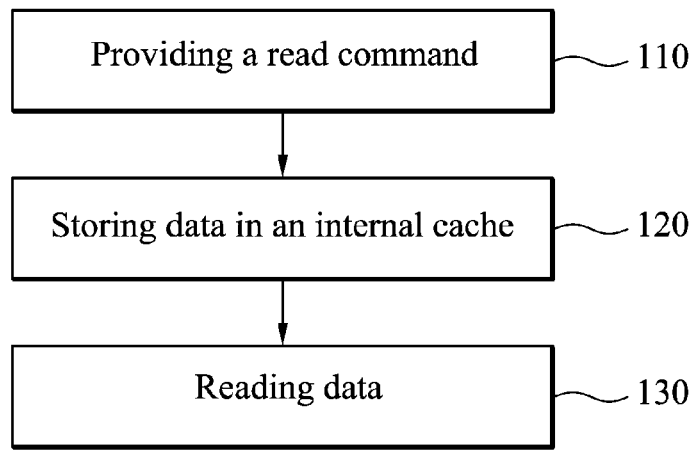
FIG. 1A is a flowchart of a conventional read method for an NAND flash memory.
Figure 1B:
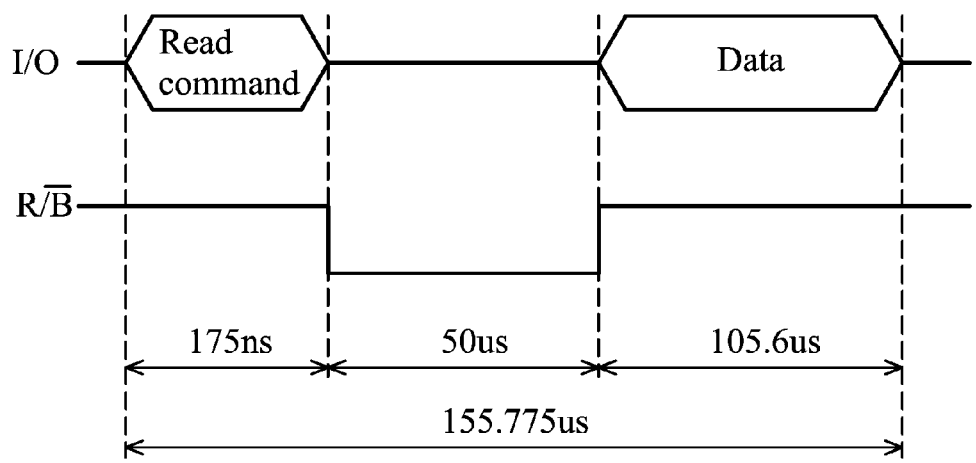
FIG. 1B is a timing diagram of reading a multi level cell.

The values of the MSBs are output after the values of all MSBs are completely obtained and recorded. As shown in FIG. 2B, the time for obtaining and recording was 20 us such that the total time for reading the NAND flash memory was about 125.775 us. Compared with FIG. 1A, the time for obtaining and recording was 50 us. Thus, the total time for reading the NAND flash memory was 155.775 us and was longer than the invention. Thus, the control method as shown in FIG. 2A effectively reduces the total time for reading the NAND flash memory and increases the performance of the NAND flash memory.

Figure 3:
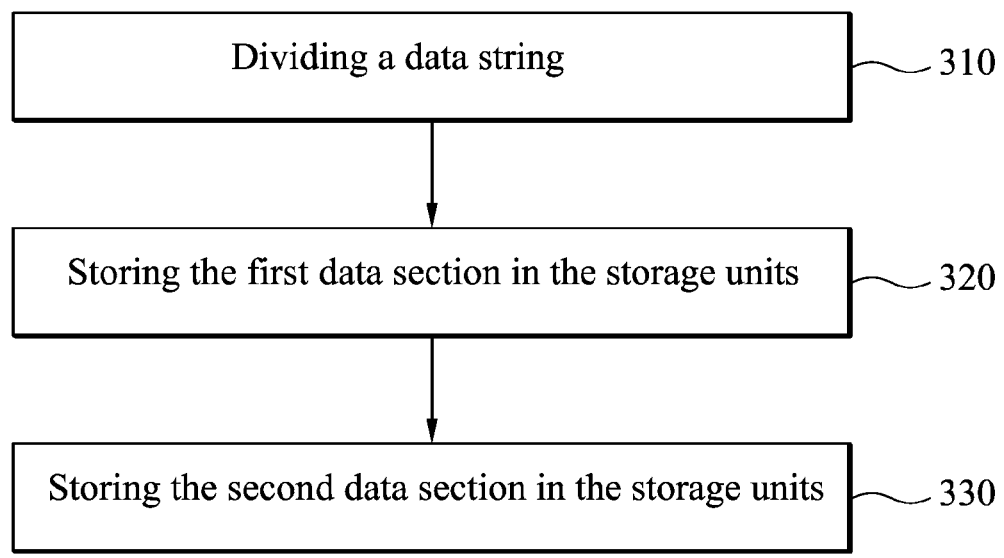
FIG. 3 is a flowchart of an exemplary embodiment of a control method for a memory in a write mode.

FIG. 3 is a flowchart of an exemplary embodiment of a control method for a memory in a write mode. A data string is divided (step 310). The data string is a combination of 0 and 1. In one embodiment, if the storage unit stores two bits, the data string can be divided into a first data section and a second data section. The first half of the data string would be the first data section. The second half of the data string would be the second data section. The data length of the first data section is the same as the data length of the second data section. The first data section comprises a plurality of first bits. The second data section comprises a plurality of second bits. In one embodiment, the first and the second data sections are a combination of 0 and 1. In another embodiment, if the storage unit stores three bits, the data string is divided into a first data section, a second data section, and a third data section. The data length of the first, the second, and the third data sections are the same.

In step 320, each first bit is stored in one corresponding storage unit. The first bits are served as the MSBs. For example, assuming the value of the first bits are 110. The value of the first bits "1" is stored in a first storage unit among the storage units, the value of the first bits "1" is stored in a second storage unit among the storage units, and the value of the first bits "0" is stored in a third storage unit among the storage units. In some embodiments, the first bits are simultaneously or sequentially stored in the storage units. For example, the first bits "1" is stored in the first storage unit, meanwhile, the first bits "1" is stored in the second storage unit, meanwhile, the first bits "0" is stored in the third storage unit. In other embodiments, after the first bits "1" is stored in the first storage unit, the second storage unit starts to store the first bits "1". After the first bits "1" is stored in the second storage unit, the third storage unit then starts to store the first bits "0".

In step 330, the second bits of the second data section are stored in the storage units, respectively. The second bits are served as the neighboring bits, wherein each neighboring bit neighbors the MSBs. In one embodiment, the second bits are simultaneously stored in the storage units. If the storage unit stores two bits, the second bits are least significant bits (LSBs).

Figure 4:
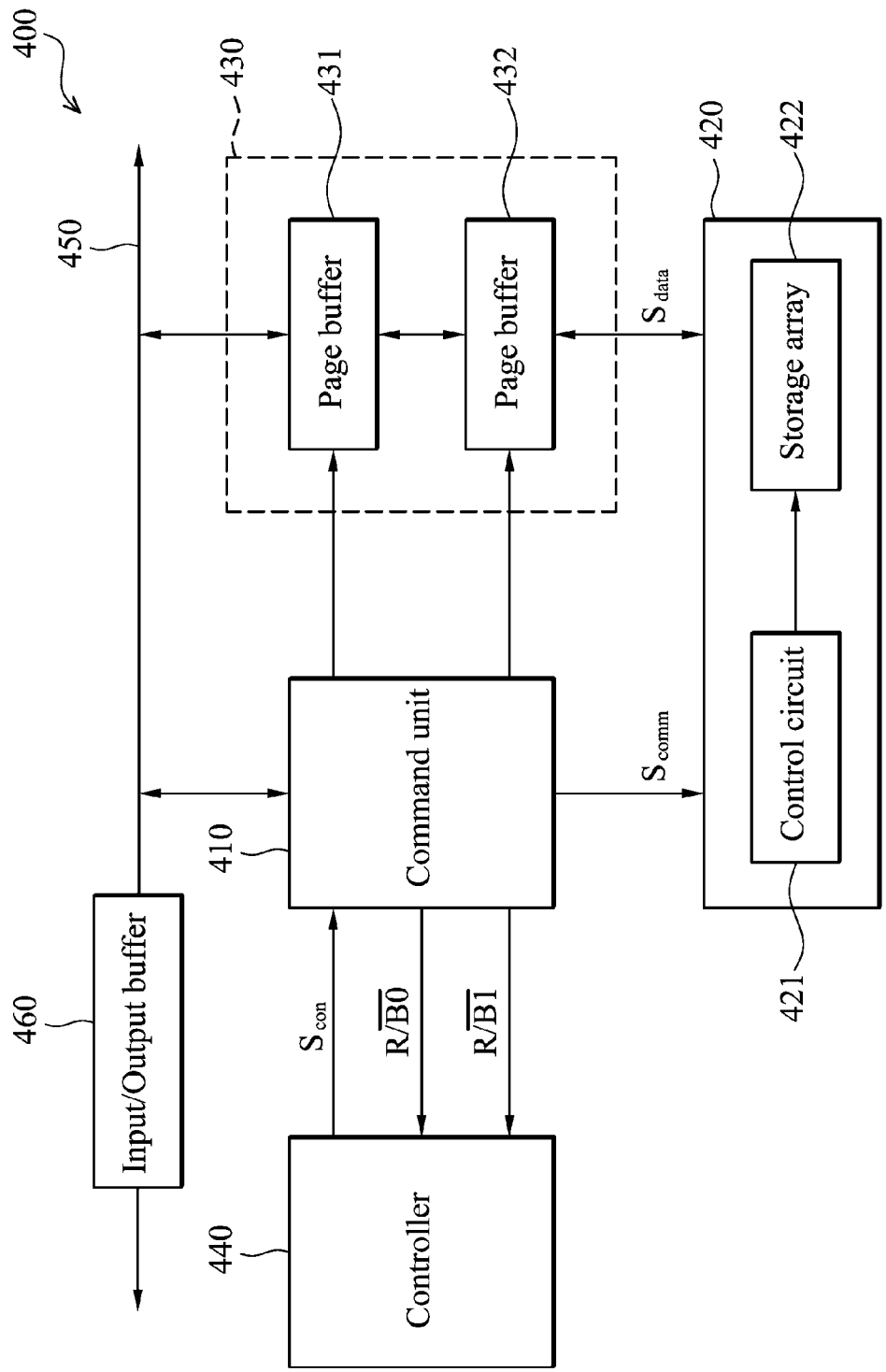
FIG. 4 is a schematic diagram of an exemplary embodiment of a processing system.

FIG. 4 is a schematic diagram of an exemplary embodiment of a processing system. The processing system 400 comprises a command unit 410, a memory 420, and a memory module 430. The command unit 410 generates a control signal $S_{comm}$ to the memory 420. For example, in a read mode, the control signal $S_{comm}$ is a read command. Thus, the memory 420 outputs data $S_{data}$. In a write mode, the control signal $S_{comm}$ is a write command. Thus, the memory 420 receives data $S_{data}$.

The memory 420 comprises a control circuit 421 and a storage array 422. The storage array 422 comprises a plurality of storage units. In this embodiment, the memory 420 is an NAND flash memory and each storage unit is an MLC. In a read mode, the control circuit 421 obtains the value of the MSB of each storage unit and then obtains the value of the neighboring bit of each storage unit according to the control signal $S_{comm}$, wherein each neighboring bit neighbors with one MSB.

In one embodiment, the control circuit 421 selects a first preset value among the preset values and provides the first preset value to all storage units to obtain the values of all MSBs according to the control signal $S_{comm}$. The control circuit 421 utilizes the result of providing the first preset values to select a second preset value among the preset values. The control circuit 421 provides the second preset value to the storage units to obtain the values of the neighboring bit.

For example, if each storage unit stores two bits, the values of the two bits may be 00, 01, 11, or 10. To obtain the values of the storage units, the voltages V1~V4 are required. The voltage V1 is less than the voltage V2. The voltage V2 is less than the voltage V3. The voltage V3 is less than the voltage V4. The preset values P1~P3 are defined according to the voltages V1~V4. The preset value P1 is a minimum value. The preset value P3 is a maximum value. The preset value P2 is a middle value between the preset values P1 and P3. In one embodiment, the sum of the preset values P1 and P3 is averaged and the averaged result is referred to as the preset value P2. In one embodiment, the preset value P2 is provided to each storage unit. The values of all MSBs are obtained according to the result of providing the preset value P2.

Assuming that a storage unit stores two bits and the values of the two bits is 10 or 11. After providing the preset value P2, a first state may be generated, such as the storage unit is at a high level. Thus, it is obtained that the value of the MSB is 1 according to the result of providing the preset value P2. Since the first state is generated, the control circuit 421 then provides a higher preset value P3 than the preset value P2 to the storage unit. The neighboring bit is obtained according to the result of providing the preset value P3. If the result of providing the preset value P3 is to generate the first state again, the neighboring bit is 1. Thus, it is obtained that the values stored in the state unit is 11. If the result of providing the preset value P3 is to generate a second state, the neighboring bit is 0. Thus, it is obtained that the values stored in the state unit is 10.

Assuming that the values stored in the storage unit is 00 or 01. When the preset value P2 is provided to the storage unit, a second state may be generated, such as the storage unit at a low level. Thus, it is obtained that the value of the MSB is 0 when the second state is generated. Since the second state is generated, the control circuit 421 provides a lower preset value P1 than the preset value P2 to the storage unit. The value of the neighboring bit is obtained according to the result of providing the preset value P1. If the result of providing the preset value P1 is to generate the first state, the neighboring bit is 1. Thus, it is obtained that the values stored in the state unit is 01. If the result of providing the preset value P1 is to generate the second state, the neighboring bit is 0. Thus, it is obtained that the values stored in the state unit is 00.

The memory module 430 comprises page buffers 431 and 432. In this embodiment, page buffers 431 and 432 are independent. In other embodiments, a single buffer is divided into a first half serving as the page buffer 431 and a second half serving as the page buffer 432.

The values of all MSBs are recorded in the page buffer 431. When the values of all MSBs are completely recorded in the page buffer 431, the command unit 410 activates the ready signal R/$\overline{B0}$. In one embodiment, when the ready signal R/$\overline{B0}$ is activated, the controller 440 utilizes the control signal $S_{con}$ to control the command unit 410 such that the command unit 410 drives the page buffer 431. Thus, the page buffer 431 outputs the recorded values to the bus 450. Additionally, in this embodiment, the values of all MSBs are indirectly recorded in the page buffer 431 via the page buffer 432. In other embodiment, the values of all MSBs are directly recorded in the page buffer 431.

The values of all neighboring bits are recorded in the page buffer 432. When the values of all neighboring bits have been completely recorded in the page buffer 432, the command unit 410 activates the ready signal R/$\overline{B1}$. In one embodiment, when the ready signal R/$\overline{B1}$ is activated, the controller 440 utilizes the control signal $S_{con}$ to control the command unit 410 such that the command unit 410 drives the page buffer 432. Thus, the page buffer 432 outputs the recorded values to the bus 450.

In some embodiments, the page buffer 431 outputs the recorded values to the bus 450, and simultaneously, the control circuit 421 starts to obtain and record the values of the neighboring bits in the page buffer 432.

In a write mode, the command unit 410 controls the page buffers 431 and 432 such that the page buffers 431 and 432 receive the data provided by the bus 450 and transmit the received data to the memory 420. In one embodiment, the command unit 410 divides the data string provided by the bus 450 into a first data section and a second data section. The first data section is stored in the page buffer 431. The second data section is stored in the page buffer 432. In this embodiment, the first data section comprises a plurality of first bits and the second data section comprises a plurality of second bits.

In the write mode, all storage units of the storage array 422 store data, which is stored in the page buffer 431. The data stored in the storage units are the values of the first bits of the first data section. Each first bit is served as an MSB of the corresponding storage unit. Then, all storage units of the storage array 422 store data, which is stored in the page buffer 432. The data stored in the storage units are the values of the second bits of the second data section. Each second bit is served as a neighboring bit of the corresponding storage unit, wherein the neighboring bit neighbors the MSB. In one embodiment, the control circuit 421 controls the storage array 422 to store the first or the second bits.

Figure 5:
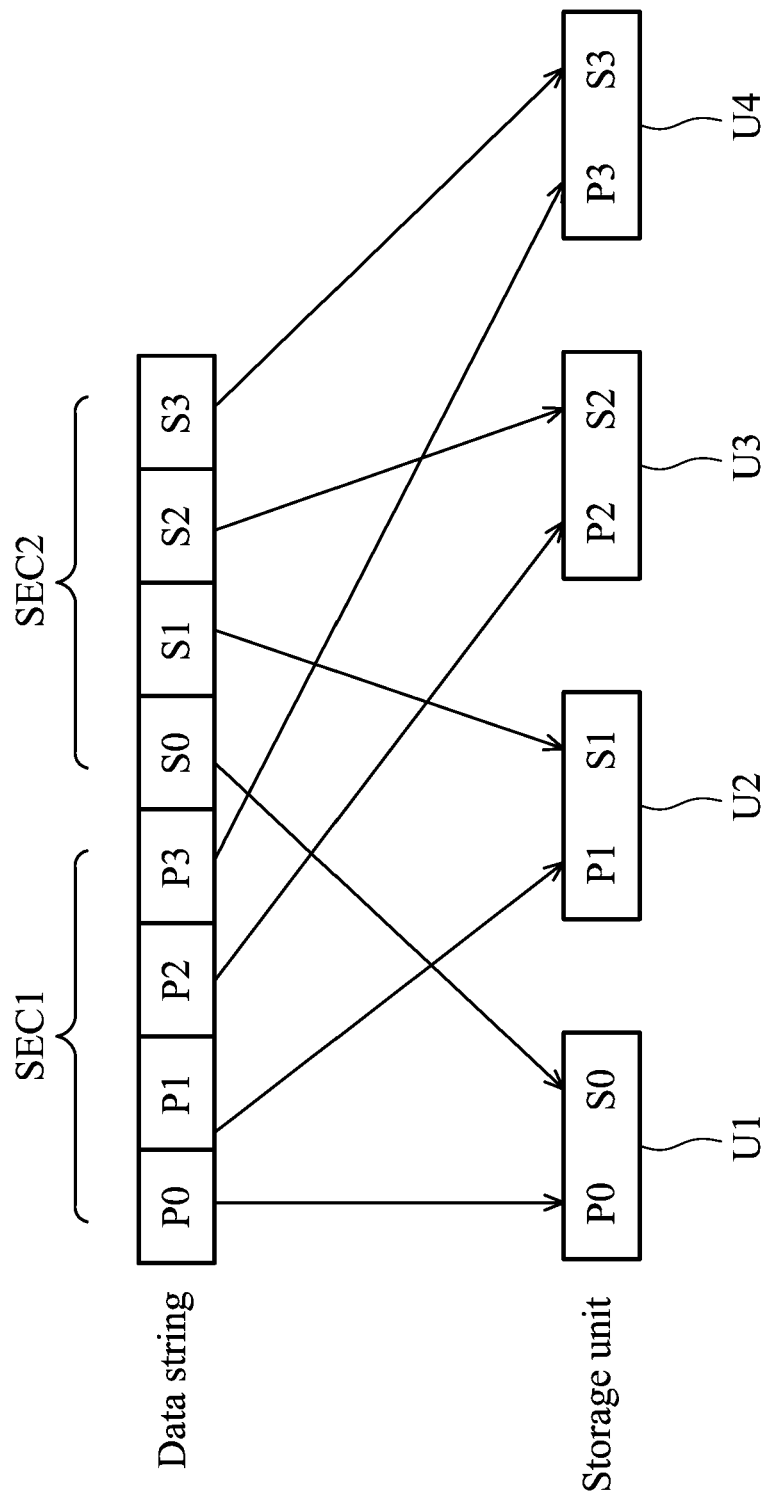
FIG. 5 is a schematic diagram of values stored in the storage unit.

FIG. 5 is a schematic diagram of values stored in the storage unit. For clarity, only eight bits and four storage units U1~U4 are shown. As shown in FIG. 5, the data string is divided into data sections SEC1 and SEC2. The values of bits P0~P3 of the data section SEC1 are stored in the storage units U1~U4, respectively. The values of bits S0~S3 of the data section SEC2 are stored in the storage units U1~U4, respectively.

The bits P0~P3 are served as MSBs of the storage units U1~U4 and the bits S0~S3 are served as neighboring bits of the storage units U1~U4. For example, the bit P0 is an MSB of the storage unit U1 and the bit S0 is served as a neighboring bit of the storage unit U1. In this embodiment, since each of the storage units only stores two bits, the bits S0~S3 are LSBs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A control method for a memory comprising storage units, each storing a plurality of bits, wherein in a read mode, the control method comprises:
   providing a read command to the memory;
   obtaining and recording the values of a plurality of most significant bits (MSB) of all of the storage units corresponding to the read command from the memory, wherein a number of the storage units is greater than one;
   outputting the values of the plurality of most significant bits of all of the storage units corresponding to the read command to a bus;
   obtaining and recording the values of neighboring bits of all of the storage units corresponding to the read command from the memory, wherein each neighboring bit neighbors one corresponding most significant bit; and
   outputting the values of the neighboring bits of all of the storage units corresponding to the read command to the bus after outputting the values of the plurality of most significant bits of all of the storage units corresponding to the read command to the bus.

2. The control method as claimed in claim 1, wherein the step of outputting the values of the plurality of most significant bits and the step of obtaining and recording the values of the neighboring bits are simultaneously executed.

3. The control method as claimed in claim 2, further comprising:
   after outputting the values of the plurality of most significant bits, determining whether the values of all neighboring bits have been obtained and recorded.

4. The control method as claimed in claim 1, wherein the values of the plurality of most significant bits are recorded in a first page buffer and the values of the neighboring bits are recorded in a second page buffer.

5. The control method as claimed in claim 1, wherein in a write mode, the control method further comprises:
   dividing a data string into a first data section and a second data section, wherein the first data section comprises a plurality of first bits and the second data section comprises a plurality of second bits;
   storing the first bits in the storage units, respectively, wherein each first bit serves as the most significant bit of each storage unit; and
   storing the second bits in the storage units, respectively, wherein the second bits serve as the neighboring bit of each storage unit.

6. A memory coupled to a memory module and a command unit, wherein the command unit provides a read command to the memory in a read mode, comprising:
   storage units, each storing a plurality of bits; and
   a control circuit, based on the read command, obtaining the values of a plurality of most significant bits of all of the storage units corresponding to the read command from the memory and recording the values of the plurality of most significant bits of all of the storage units corresponding to the read command in the memory module, wherein a number of the storage units is greater than one, and then obtaining the values of neighboring bits of all of the storage units corresponding to the read command from the memory and recording the values of the neighboring bits of all of the storage units corresponding to the read command in the memory module, wherein each neighboring bit neighbors one corresponding most significant bit, and wherein the memory module outputs the values of the plurality of most significant bits of all of the storage units corresponding to the read command to a bus, and wherein the memory module outputs the neighboring bits of all of the storage units corresponding to the read command to the bus after outputting the values of the plurality of most significant bits.

7. The memory as claimed in claim 6, wherein the memory module comprises:
   a first page buffer storing the values of the plurality of most significant bits; and
   a second page buffer storing the values of the neighboring bits.

8. The memory as claimed in claim 7, wherein in a write mode, the command unit divides a data string into a first data section and a second data section, the first data section comprises a plurality of first bits, the second data section comprises a plurality of second bits, and wherein the control circuit stores the first data section in the first page buffer and stores the second data section in the second page buffer.

9. The memory as claimed in claim 8, wherein in the write mode, the control circuit stores the first bits stored in the first page buffer in the storage units, respectively, and wherein each first bit is served as the most significant bit of the storage unit.

10. The memory as claimed in claim 8, wherein in the write mode, the control circuit stores the second bits stored in the second page buffer in the storage units, respectively, and wherein each second bit is served as the neighboring bit of the storage unit.

11. The memory as claimed in claim 7, wherein the memory module outputs the values of the plurality of most significant bits, and simultaneously, the control circuit obtains the values of the neighboring bits and records the values of the neighboring bit in the memory module.

12. A processing system, comprising:
a command unit providing a read command in a read mode;
a memory comprising:
storage units, each storing a plurality of bits; and
a control circuit, based on the read command, obtaining the values of a plurality of most significant bits of all of the storage units corresponding to the read command and then obtaining the values of neighboring bits of all of the storage units corresponding to the read command, wherein a number of the storage units is greater than one, wherein each neighboring bit neighbors one corresponding most significant bit; and
a memory module comprising:
a first page buffer storing the values of the plurality of most significant bits; and
a second page buffer storing the values of the neighboring bits,
wherein when the values of the plurality of most significant bits of all of the storage units corresponding to the read command are recorded in the first page buffer, the command unit activates a first ready signal, and when the values of the neighboring bits of all of the storage units corresponding to the read command are recorded in the second page buffer, the command unit activates a second ready signal, and wherein the memory module outputs the values of the neighboring bits of all of the storage units corresponding to the read command to a bus after the memory module outputs the values of the plurality of most significant bits of all of the storage units corresponding to the read command to the bus.

13. The processing system as claimed in claim 12, wherein in the read mode, when the first ready signal is activated, the first page buffer outputs the values of the plurality of most significant bits to a bus and when the second ready signal is activated, the second page buffer outputs the values of the neighboring bits to the bus.

14. The processing system as claimed in claim 13, wherein the first page buffer outputs the values of the plurality of most significant bits to the bus, and simultaneously, the control circuit obtains the values of the neighboring bits and records the values of the neighboring bits in the second page buffer.

15. The processing system as claimed in claim 12, wherein in a write mode, the command unit divides a data string into a first data section and a second data section, and the first data section comprises a plurality of first bits, and the second data section comprises a plurality of second bits, and wherein the command unit stores the first data section in the first page buffer and stores the second data section in the second page buffer.

16. The processing system as claimed in claim 15, wherein in the write mode, the control circuit controls the storage units to store the first bits, respectively, and wherein each first bit is served as the most significant bit of the corresponding storage unit.

17. The processing system as claimed in claim 15, wherein in the write mode, when the first bits are stored in the storage units, the control circuit controls the storage units to store the second bits, respectively, and wherein each second bit is served as the neighboring bit of the corresponding storage unit.

18. The memory as claimed in claim 7, wherein the memory module comprises:
a command unit activating a first ready signal when the values of all MSBs are recorded in the first page buffer and activating a second ready signal when the values of all neighboring bits are recorded in second first page buffer; and
a controller controlling the command unit to drive the first page buffer when the first ready signal is activated and controlling the command unit to drive the second page buffer when the second ready signal is activated,
wherein when the first page buffer is driven, the first page buffer outputs the recorded values to the bus, and when the second page buffer is driven, the second page buffer outputs the recorded values to the bus.

19. The memory as claimed in claim 7, wherein the memory module comprises a command unit, the command unit divides a data string provided by the bus into a first data section and a second data section, the first data section comprises a plurality of first bits, the second data section comprises a plurality of second bits, the first data section is stored in the first page buffer, the second data second is stored in the second page buffer, the control circuit controls the storage units to store the first and the second bits, each first bit is served as an MSB of the corresponding storage unit and each second bit is served as a neighboring bit of the corresponding storage unit.

20. The memory as claimed in claim 7, wherein the values of all MSBs are indirectly recorded in the first page buffer via the second page buffer.

* * * * *